(12) United States Patent
Yen et al.

(10) Patent No.: US 9,136,241 B2
(45) Date of Patent: Sep. 15, 2015

(54) CHIP PACKAGE AND MANUFACTURING METHOD THEREOF

(76) Inventors: Yu-Lin Yen, Taipei (TW); Kuo-Hua Liu, Pingzhen (TW); Yu-Lung Huang, Daxi Township (TW); Tsang-Yu Liu, Zhubei (TW); Yen-Shih Ho, Kaohsiung (TW)

( * ) Notice: Subject to any disclaimer, the term of this patent is extended or adjusted under 35 U.S.C. 154(b) by 28 days.

(21) Appl. No.: 13/446,954

(22) Filed: Apr. 13, 2012

(65) Prior Publication Data

US 2012/0261809 A1 Oct. 18, 2012

(30) Foreign Application Priority Data

Apr. 13, 2011 (CN) .......................... 2011 1 0092927

(51) Int. Cl.
- H01L 23/04 (2006.01)
- H01L 21/50 (2006.01)
- H01L 23/00 (2006.01)
- H01L 23/10 (2006.01)

(52) U.S. Cl.
CPC ................ *H01L 24/29* (2013.01); *H01L 23/10* (2013.01); *H01L 24/32* (2013.01); *H01L 24/83* (2013.01); *H01L 2224/29011* (2013.01); *H01L 2224/2919* (2013.01); *H01L 2224/29035* (2013.01); *H01L 2224/29076* (2013.01); *H01L 2224/32225* (2013.01); *H01L 2224/83191* (2013.01); *H01L 2224/83855* (2013.01); *H01L 2224/83862* (2013.01); *H01L 2224/83871* (2013.01); *H01L 2224/94* (2013.01); *H01L 2924/00013* (2013.01); *H01L 2924/12041* (2013.01); *H01L 2924/1461* (2013.01)

(58) Field of Classification Search
CPC ......... H01L 21/78; H01L 23/04; H01L 21/50; H01L 24/29

USPC ............ 257/684, E21.499, E23.182; 438/113
See application file for complete search history.

(56) References Cited

U.S. PATENT DOCUMENTS

| | | | | |
|---|---|---|---|---|
| 5,504,035 A | * | 4/1996 | Rostoker et al. | 228/180.22 |
| 6,096,155 A | | 8/2000 | Harden et al. | |
| 6,252,301 B1 | * | 6/2001 | Gilleo et al. | 257/690 |
| 2002/0132389 A1 | * | 9/2002 | Patel et al. | 438/97 |
| 2003/0010431 A1 | * | 1/2003 | Feldman et al. | 156/250 |
| 2004/0036069 A1 | * | 2/2004 | Barton et al. | 257/59 |
| 2006/0043555 A1 | * | 3/2006 | Liu | 257/680 |
| 2007/0110361 A1 | * | 5/2007 | Harden et al. | 385/14 |

(Continued)

FOREIGN PATENT DOCUMENTS

| | | |
|---|---|---|
| CN | 1276916 | 12/2000 |
| JP | 2001-519601 | 10/2001 |

(Continued)

*Primary Examiner* — Kevin Parendo
*Assistant Examiner* — Lamont Koo
(74) *Attorney, Agent, or Firm* — Liu & Liu

(57) ABSTRACT

An embodiment of the invention provides a manufacturing method of a chip package including: providing a semiconductor wafer having a plurality of device regions separated by a plurality of scribe lines; bonding a package substrate to the semiconductor wafer wherein a spacer layer is disposed therebetween and defines a plurality of cavities respectively exposing the device regions and the spacer layer has a plurality of through holes neighboring the edge of the semiconductor wafer; filling an adhesive material in the through holes wherein the material of the spacer layer is adhesive and different from the adhesive material; and dicing the semiconductor wafer, the package substrate and the spacer layer along the scribe lines to form a plurality of chip packages separated from each other.

24 Claims, 24 Drawing Sheets

(56) References Cited

U.S. PATENT DOCUMENTS

2007/0120478 A1* 5/2007 Lee et al. .................. 313/512
2009/0321903 A1* 12/2009 Shinogi et al. ............. 257/684
2010/0025837 A1* 2/2010 Shinoda et al. ............ 257/686

FOREIGN PATENT DOCUMENTS

| JP | 2002-231919 | | 8/2002 |
|----|-------------|---|--------|
| JP | 2002231919 A | * | 8/2002 |
| JP | 2005-117011 | | 4/2005 |

* cited by examiner

CHIP PACKAGE AND MANUFACTURING METHOD THEREOF

CROSS REFERENCE TO RELATED APPLICATIONS

This Application claims priority of China Patent Application No. 201110092927.9, filed on Apr. 13, 2011, the entirety of which is incorporated by reference herein.

BACKGROUND OF THE INVENTION

1. Field of the Invention

The present invention relates to a chip package, and in particular relates to a chip package formed by a wafer-level packaging process and manufacturing methods thereof.

2. Description of the Related Art

A chip package is used to protect a chip packaged therein and provides conducting routes between the chip and an external electronic element. In the present wafer level packaging process, the chip packages located in the periphery region of the wafer may suffer from problems such as bad adhesion and/or moisture infiltration, which largely affects the operation of the packaged chip.

Thus, it is desired to improve the reliability of chip packages.

BRIEF SUMMARY OF THE INVENTION

An embodiment of the invention provides a manufacturing method of a chip package which includes: providing a semiconductor wafer having a plurality of device regions separated by a plurality of scribe lines; bonding a package substrate to the semiconductor wafer, wherein a spacer layer is disposed therebetween and defines a plurality of cavities respectively exposing the device regions and the spacer layer has a plurality of through holes neighboring the edge of the semiconductor wafer; filling an adhesive material in the through holes wherein a material of the spacer layer is adhesive and different from the adhesive material; and dicing the semiconductor wafer, the package substrate and the spacer layer along the scribe lines to form a plurality of chip packages separated from each other.

An embodiment of the invention provides a chip package, which includes: a semiconductor substrate having a device region; a package substrate disposed on the semiconductor substrate; a spacer layer disposed between the semiconductor substrate and the package substrate, defining a cavity exposing the device region; and a plurality of independent adhesive structures embedded in the spacer layer and located outside of the cavity, wherein a material of the spacer layer is different from that of the adhesive structures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensor device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer scale packaging process. In addition, the above mentioned wafer scale packaging process may also be adapted to form chip packages of multi-layer integrated circuit devices by stacking a plurality of wafers having integrated circuits.

In the present invention, a plurality of through holes neighboring an edge of a semiconductor wafer are formed in a spacer layer between the semiconductor wafer and a package substrate, and an adhesive material is filled in the through holes to improve the adhesion of the spacer layer to the semiconductor wafer and/or the package substrate.

Figure 1A:
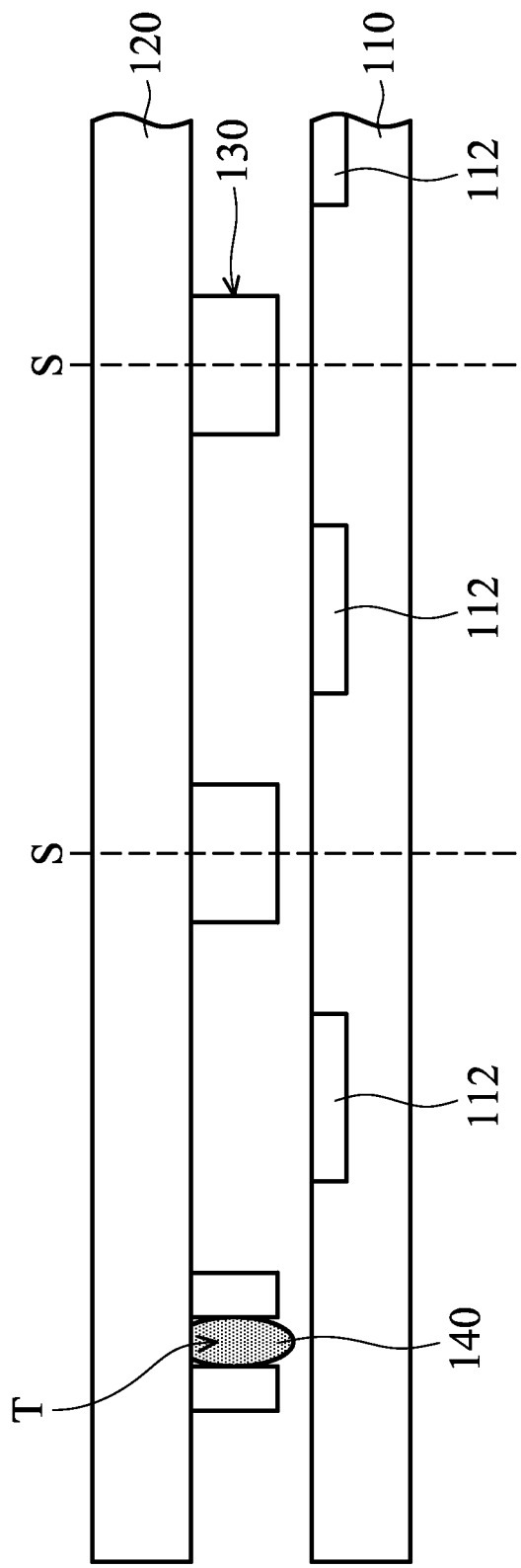
FIGS. 1A-1C are cross-sectional views showing the steps of forming a chip package according to an embodiment of the present invention.
Figure 1B:
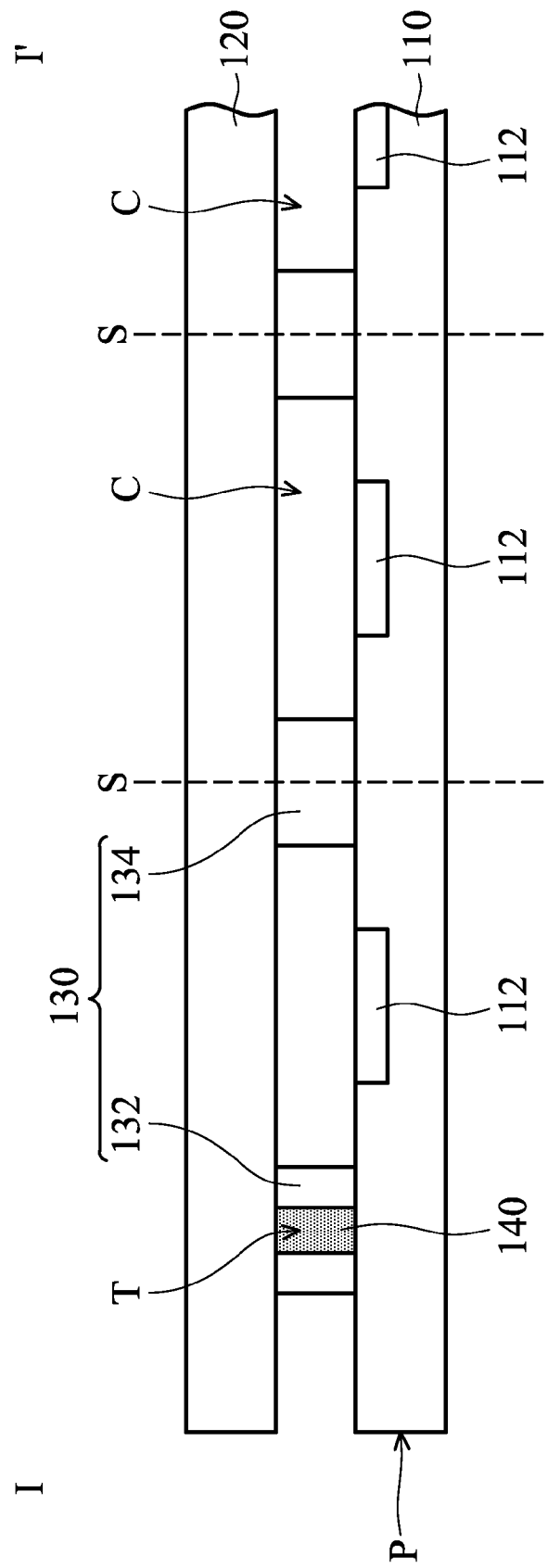
Figure 1C:
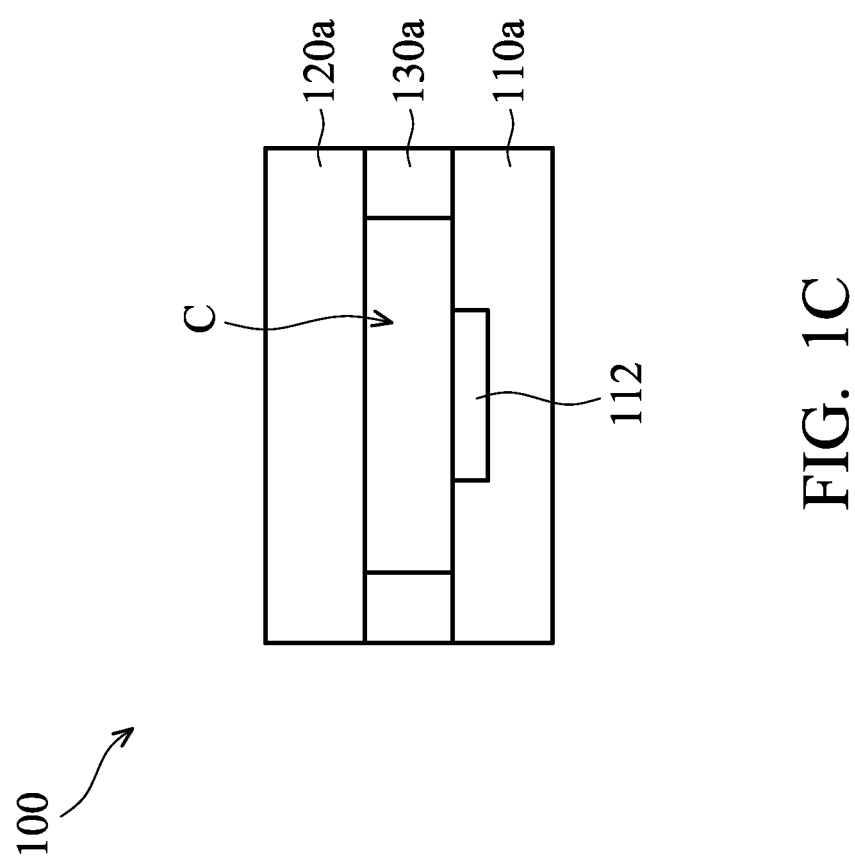
Figure 2:
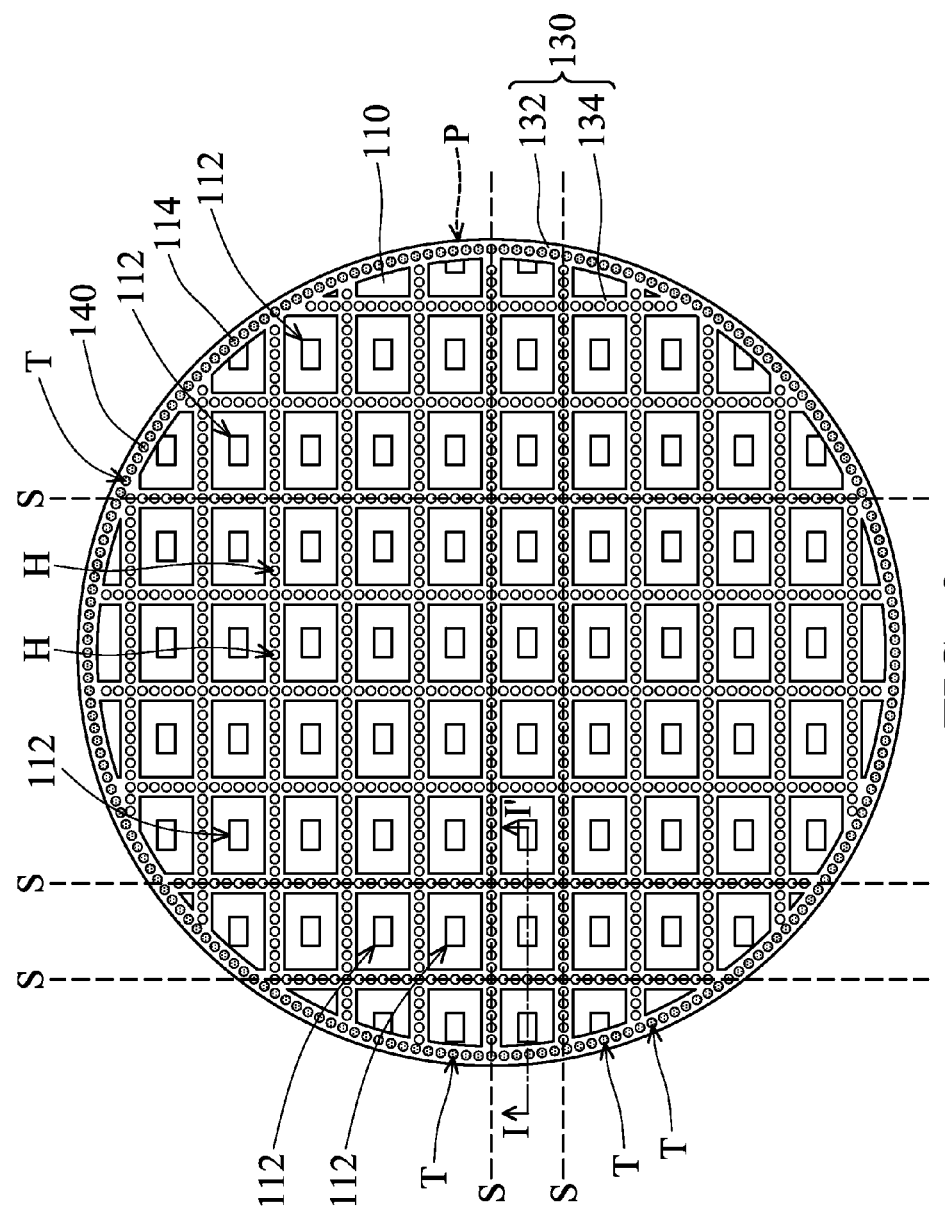
FIG. 2 is a top view of the structure shown in FIG. 1B.

FIGS. 1A-1C are cross-sectional views showing the steps of forming a chip package according to an embodiment of the present invention, and FIG. 2 is a top view of the structure shown in FIG. 1B. FIG. 1B is a cross-sectional view along the line I-I' in FIG. 2, and for simplicity sake, FIG. 2 omits depicting the package substrate.

Firstly, referring to FIG. 1A, a semiconductor wafer 110 and a package substrate 120 are provided, wherein the semiconductor wafer 110 has a plurality of device regions 112 separated by a plurality of scribe lines S.

Then, referring to FIGS. 1B and 2, the package substrate 120 is bonded to the semiconductor wafer 110, wherein a spacer layer 130 is disposed between the package substrate 120 and the semiconductor wafer 110. The spacer layer 130 defines a plurality of cavities C respectively exposing the device regions 112. The spacer layer 130 has a plurality of through holes T neighboring the edge P of the semiconductor wafer 110.

In the present embodiment, the spacer layer 130 has an outer annular portion 132 and a spacer portion 134, wherein the outer annular portion 132 neighbors the edge P of the semiconductor wafer 110, the spacer portion 134 is located on the scribe lines S between the device regions 112, and the through holes T are in the outer annular portion 132. An adhesive material 140 may be filled in the through holes T by, for example, screen printing.

The adhesive material 140 may be fully filled or partially filled in the through holes T. The adhesive material 140 fully filled in the through holes T may improve the adhesion between the semiconductor wafer 110, the package substrate 120, and the spacer layer 130. Even if the adhesive material 140 is partially filled in the through holes T, the adhesive material 140 may improve the adhesion of the spacer layer 130 to one of the semiconductor wafer 110 and the package substrate 120 so as to enhance the yield of the packaging process.

A material of the spacer layer 130 may be adhesive and different from the adhesive material 140. For example, the spacer layer 130 may include photo-sensitive materials (such as a photoresist) or epoxy resins, and the adhesive material 140 may include other polymer materials (such as polyimide). In the present embodiment, because the materials are used in the adhesive material 140 and the spacer layer 130, the adhesive material 140 has an adhesion greater than that of the spacer layer 130, and the adhesive material 140 has a hardness less than that of the spacer layer 130. As such, during bonding of the package substrate 120 and the semiconductor wafer 110, the spacer layer 130 may provide a sufficient support force, and the adhesive material 140 may provide an adhesion greater than that of the spacer layer 130.

Specifically, as shown in FIG. 1A, in the present embodiment, the method of bonding the package substrate 120 to the semiconductor wafer 110 includes: firstly, forming the spacer layer 130 on the package substrate 120; filling the adhesive material 140 in the through holes T; then, bonding the package substrate 120 to the semiconductor wafer 110 through the adhesive spacer layer 130 and the adhesive material 140.

Moreover, in other embodiments, the method of bonding the package substrate 120 to the semiconductor wafer 110 includes: firstly, forming the spacer layer 130 on the semiconductor wafer 110; filling the adhesive material 140 in the through holes T; then, bonding the semiconductor wafer 110 to the package substrate 120 through the adhesive spacer layer 130 and the adhesive material 140.

Furthermore, as shown in FIG. 2, the spacer layer 130 may further have a plurality of hollow through holes H in the spacer portion 134, wherein the adhesive material 140 is not filled in the hollow through holes H.

It should be noted that, in the present embodiment, because the through holes T in the outer annular portion 132 are filled with the adhesive material 140, the adhesive material 140 may improve the adhesion of the outer annular portion 132 to the semiconductor wafer 110 and/or the package substrate 120 so as to prevent delamination occurring in the laminated structure formed of the spacer layer 130, the semiconductor wafer 110, and the package substrate 120 during subsequent processes (such as thermal processes, for example, chemical vapor deposition, etc.), which improves the reliability of the wafer dicing process and the yield of the chip packaging process.

Then, a curing process may be optionally performed to the spacer layer 130 and the adhesive material 140, such that the spacer layer 130 and the adhesive material 140 may be cured at the same time or at different time, wherein the curing process is, for example, a thermal curing process, a light curing process, or other suitable curing processes.

Then, referring to FIGS. 1B and 1C, the semiconductor wafer 110, the package substrate 120, and the spacer layer 130 are diced along the scribe lines S to form a plurality of chip packages 100 separated from each other. The chip package 100 includes a semiconductor substrate 110a, a diced package substrate 120a, and a diced spacer layer 130a, wherein the semiconductor substrate 110a has a device region 112. The package substrate 120a is disposed on the semiconductor substrate 110a, and the spacer layer 130a is disposed between the package substrate 120a and the semiconductor substrate 110a and defines a cavity C.

If the chip package 100 is a photo-sensitive device or a light emitting device, the package substrate 120 may include a transparent material, such as glass, quartz, plastics, or opals.

Figure 3A:
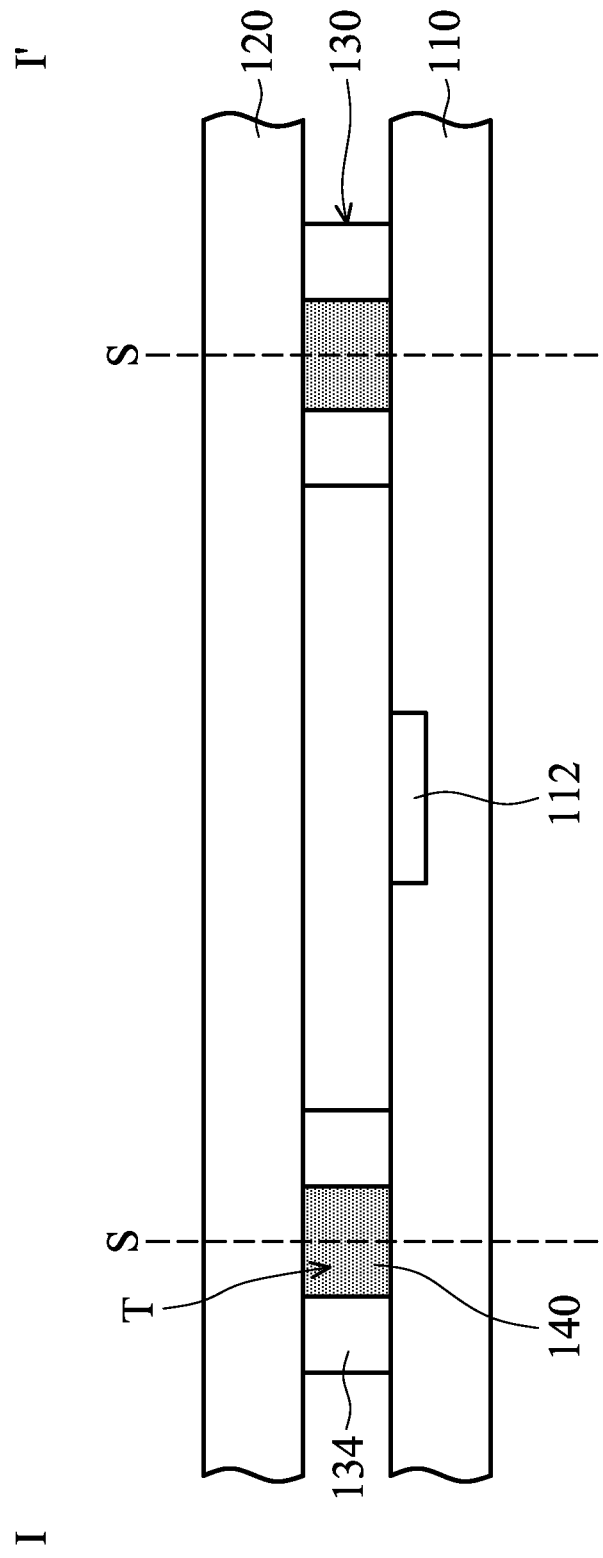
FIGS. 3A-3B are cross-sectional views showing the steps of forming a chip package according to another embodiment of the present invention.
Figure 3B:
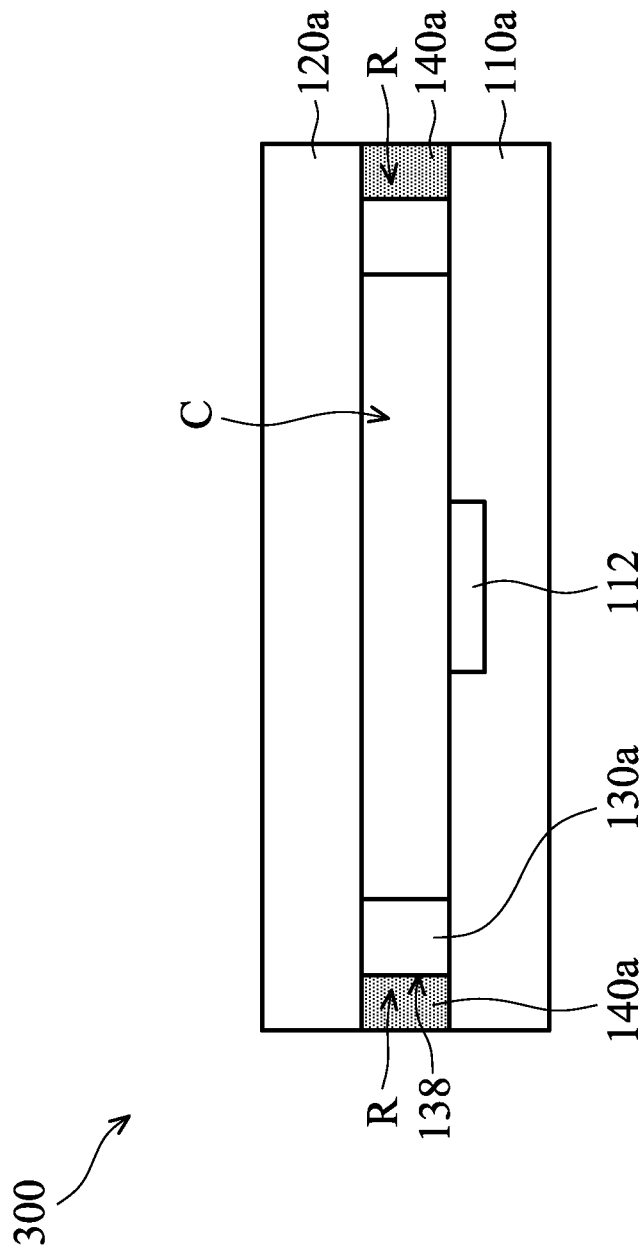

FIGS. 3A-3B are cross-sectional views showing the steps of forming a chip package according to another embodiment of the present invention.

It should be noted that, in the present embodiment, the process for forming the chip package is similar to the process shown in FIGS. 1A-1C, and the difference therebetween is that the through holes T and the adhesive material 140 of the present embodiment are further located in the spacer portion 134.

Figure 5:
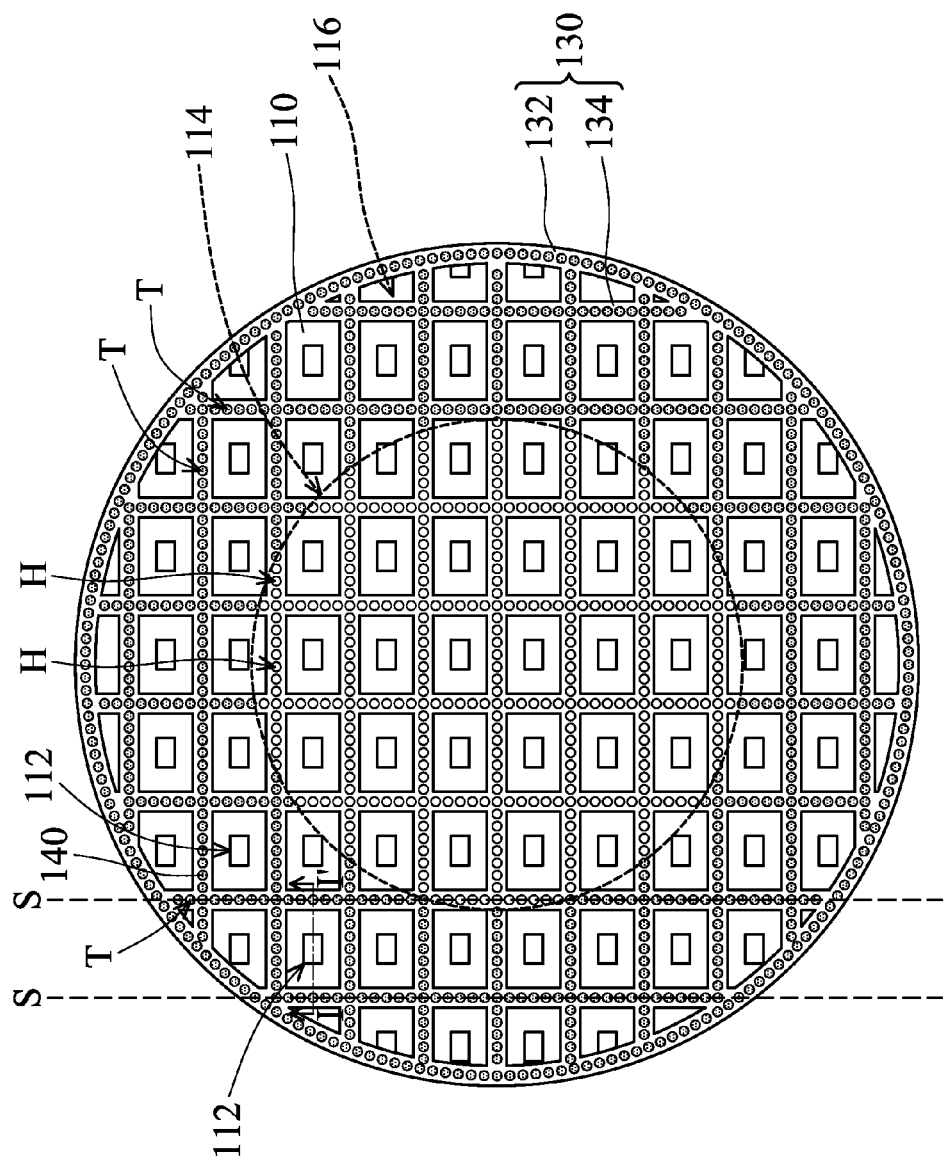
FIG. 5 is a top view of the structure shown in FIG. 3A.

FIG. 5 is a top view of the structure shown in FIG. 3A, FIG. 3A is a cross-sectional view along the line I-I' in FIG. 5, and for simplicity sake, FIG. 5 omits depicting the package substrate. Specifically, referring to FIG. 3A, the through holes T may be located in the spacer portion 134. For example, as shown in FIG. 5, the semiconductor wafer 110 may have a central region 114 and a periphery region 116 surrounding the central region 114, and the through holes T may be located in the spacer portion 134 in the periphery region 116 and located on the scribe lines S. The adhesive material 140 may be filled in the through holes T in the periphery region 116. Moreover, in the present embodiment, the hollow through holes H of the spacer layer 130 are located in the spacer portion 134 in the central region 114.

In the present embodiment, because the adhesive material 140 passing through the spacer portion 134 is arranged in a circle in the periphery region 116, the adhesion of a portion of the spacer portion 134 in the periphery region 116 to the semiconductor wafer 110 and/or the package substrate 120 is improved, which prevents delamination occurring in the laminated structure during subsequent processes. Therefore, in the present embodiment, the spacer layer 130 may not have the outer annular portion 132 filled with the adhesive material 140.

Figure 6:
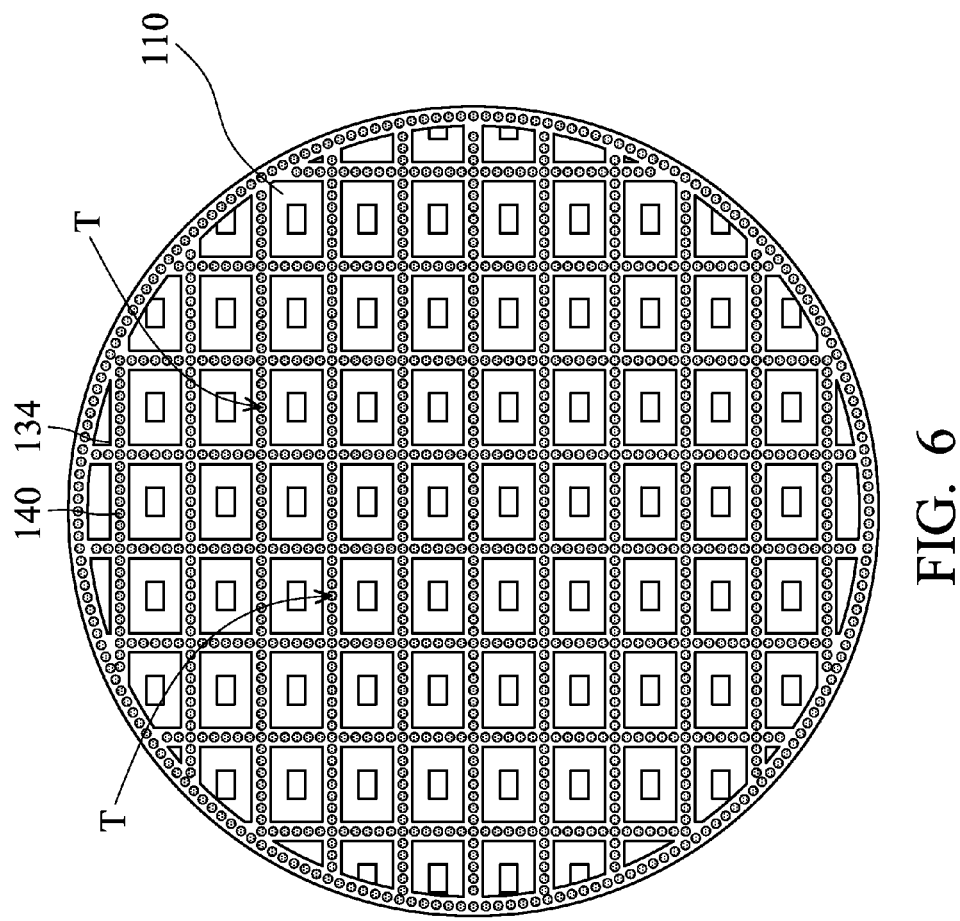
FIG. 6 shows a variation of the embodiment of FIG. 5.

FIG. 6 shows a variation of the embodiment of FIG. 5. In another embodiment, as shown in FIG. 6, the through holes T may be arranged in the whole spacer portion 134 (i.e. arranged in the central region and the periphery region of the semiconductor wafer 110), and the adhesive material 140 may be filled in the through holes T. In this case, the spacer portion 134 does not have the hollow through holes.

It should be noted that, in the present embodiment, because the through holes T in the spacer portion 134 are filled with the adhesive material 140, the adhesive material 140 may improve the adhesion of the spacer portion 134 to the semiconductor wafer 110 and/or the package substrate 120, which improves the yield of the chip packaging process.

Then, referring to FIGS. 3A and 3B, the semiconductor wafer 110, the package substrate 120, the spacer layer 130, and the adhesive material 140 in the through holes T are diced along the scribe lines S to form a plurality of chip packages 300 separated from each other.

Figure 4:
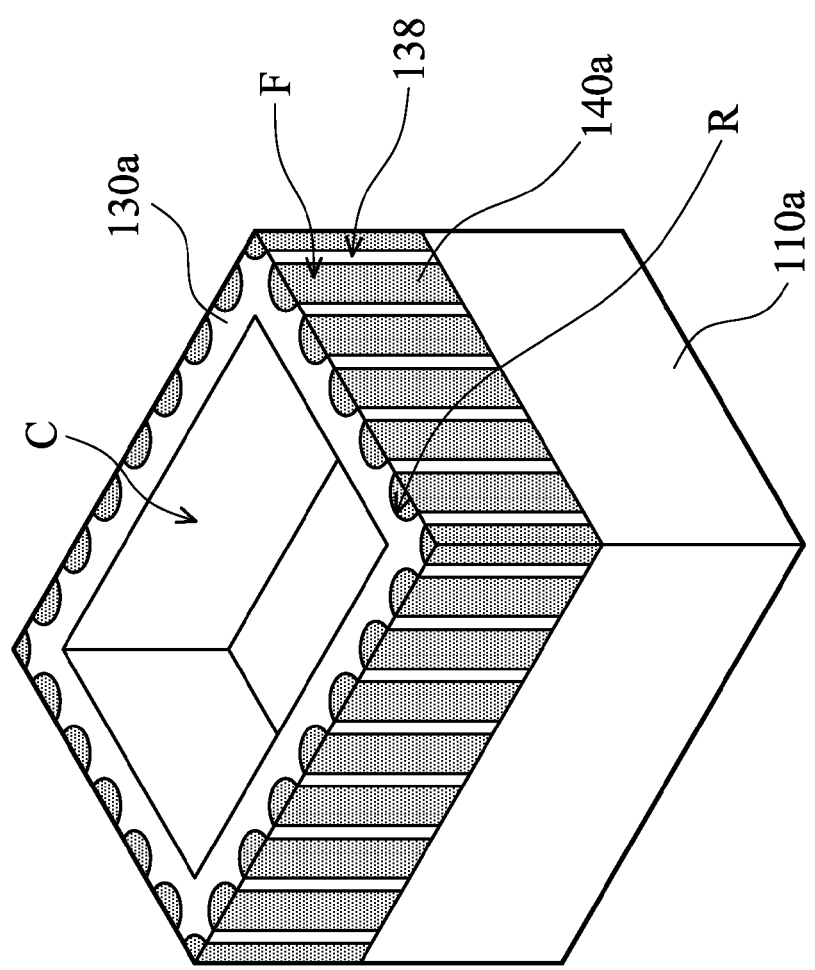
FIG. 4 is a perspective view of the chip package of FIG. 3B.

FIG. 4 is a perspective view of the chip package of FIG. 3B, and for simplicity sake, FIG. 4 omits depicting the package substrate. Referring to FIGS. 3B and 4, the chip package 300 includes a semiconductor substrate 110a, a diced package substrate 120a, a diced spacer layer 130a, and a plurality of independent adhesive structures 140a, wherein the semiconductor substrate 110a has a device region 112.

The package substrate 120a is disposed on the semiconductor substrate 110a. The spacer layer 130a is disposed between the semiconductor substrate 110a and the package substrate 120a and defines a cavity C exposing the device region 112. The adhesive structures 140a are embedded in the spacer layer 130a and located outside of the cavity C, and a portion of the spacer layer 130a separates the adhesive structures 140a, wherein the material of the spacer layer 130a is different from that of the adhesive structures 140a.

It should be noted that, in this case, the above description "the adhesive structures 140a are embedded in the spacer layer 130a" means that the adhesive structures 140a are located in the spacer layer 130a, and the spacer layer 130a exposes a portion of a surface of the adhesive structures 140a. For example, the spacer layer 130a has a sidewall 138 facing away from the cavity C, and the adhesive structures 140a are embedded in the sidewall 138. Specifically, the sidewall 138 may have a plurality of recesses R extending from the semiconductor substrate 110a to the package substrate 120a, and the adhesive structures 140a are filled in the recesses R. Because the adhesive structures 140a are embedded in the spacer layer 130a, the adhesion therebetween is good.

In the present embodiment, the adhesive structures 140a have a sidewall F facing away from the cavity C, and the sidewall F is aligned with the sidewall 138. In the present embodiment, the spacer layer 130a directly (physically) contacts the semiconductor substrate 110a and the package substrate 120a, and each of the adhesive structures 140a extends from the semiconductor substrate 110a to the package substrate 120a.

Although FIG. 4 illustrates that the adhesive structures 140a are fully filled in the recesses R, in other embodiments, the adhesive structures 140a are partially filled in the recesses R. For example, the adhesive structures 140a may be merely located at one end of the recess R neighboring the semiconductor substrate 110a and connect the semiconductor substrate 110a to the spacer layer 130a. Alternatively, the adhesive structures 140a may be merely located at one end of the recess R neighboring the package substrate 120a and connect the package substrate 120a to the spacer layer 130a.

Figure 7A:
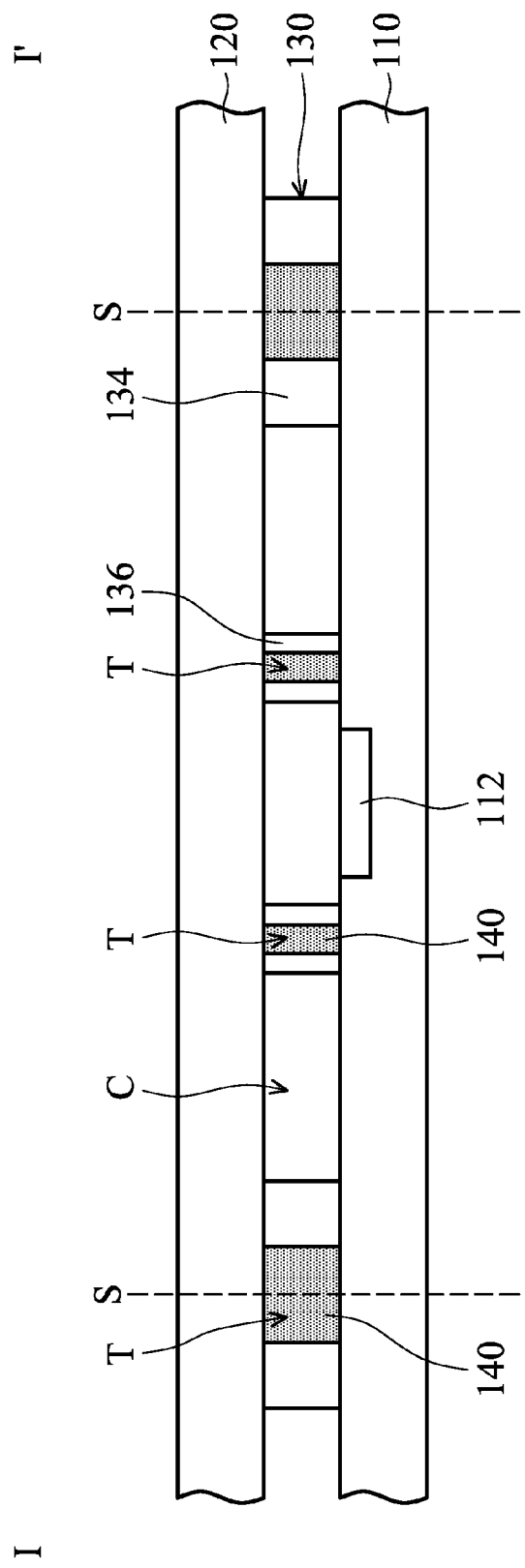
FIGS. 7A-7B are cross-sectional views showing the steps of forming a chip package according to another embodiment of the present invention.
Figure 7B:
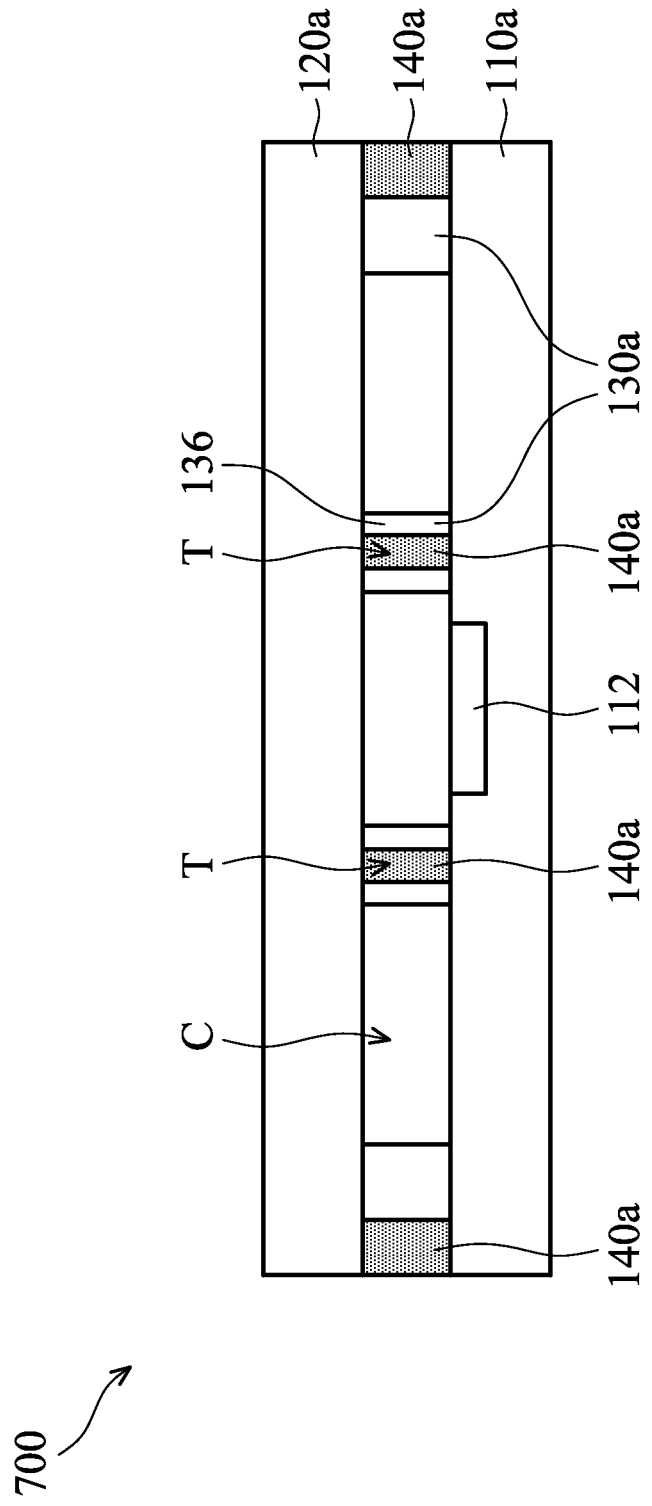

FIGS. 7A-7B are cross-sectional views showing the steps of forming a chip package according to another embodiment of the present invention.

It should be noted that, in the present embodiment, the process for forming the chip package is similar to the process shown in FIGS. 3A-3B, and the difference therebetween is that the spacer layer 130 of the present embodiment further includes a plurality of inner annular structures 136.

Figure 8:
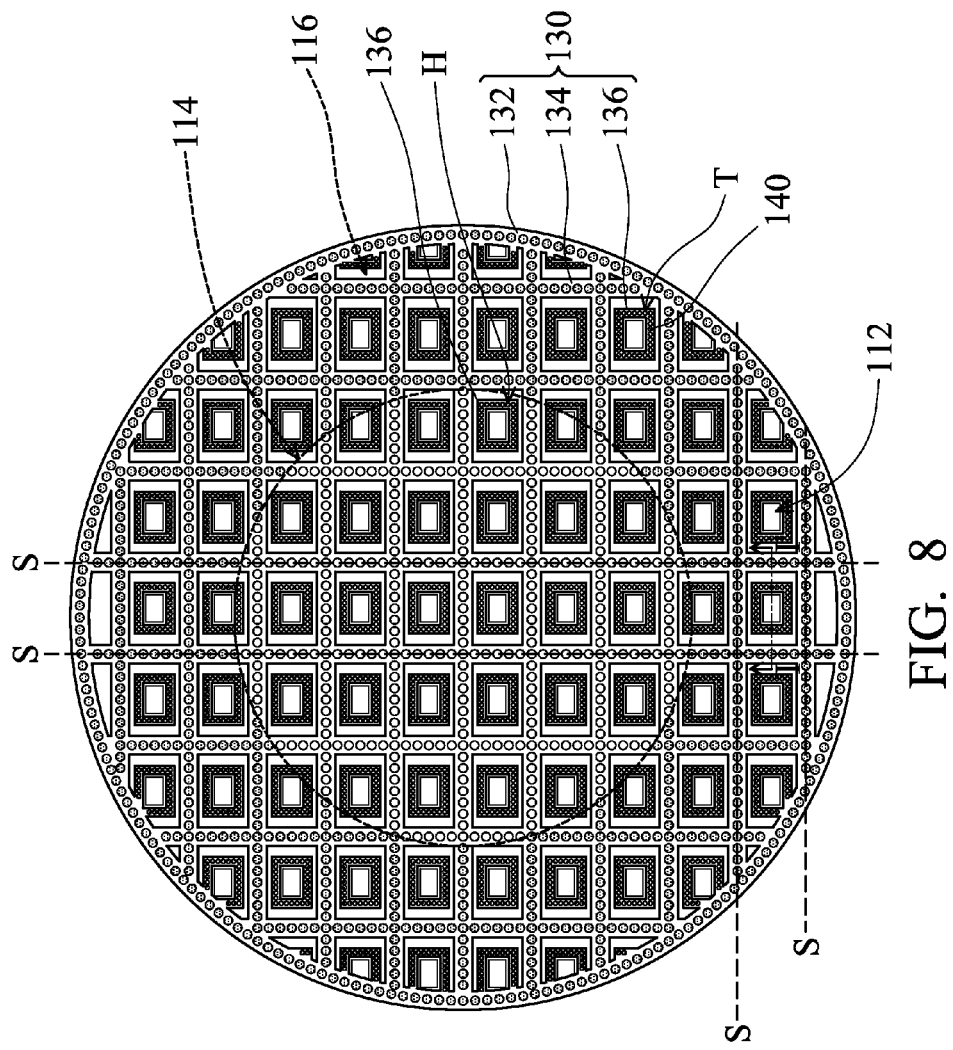
FIG. 8 is a top view of the structure shown in FIG. 7A.

FIG. 8 is a top view of the structure shown in FIG. 7A, FIG. 7A is a cross-sectional view along the line I-I' in FIG. 8, and for simplicity sake, FIG. 8 omits depicting the package substrate. Specifically, referring to FIGS. 7A and 8, the inner annular structure 136 is located in the cavity C and surrounds the device region 112, and the through holes T pass through the inner annular structure 136. The adhesive material 140 fills the through holes T.

It should be noted that, FIG. 8 shows that the inner annular structures 136 located in the periphery region 116 are passed through by the through holes T filled with the adhesive material 140, and the inner annular structures 136 located in the central region 114 are passed through by the hollow through holes H. Of course, in other embodiments, all of the inner annular structures 136 may be passed through by the through holes T filled with the adhesive material 140.

Then, referring to FIGS. 7A and 7B, the semiconductor wafer 110, the package substrate 120, the spacer layer 130, and the adhesive material 140 in the through holes T are diced along the scribe lines S to form a plurality of chip packages 700 separated from each other.

In the present embodiment, the chip package 700 is similar to the chip package 300 in FIG. 3B, and the difference therebetween is that the spacer layer 130a of the chip package 700 further includes an inner annular structure 136. The inner annular structure 136 is located in the cavity C and has a plurality of through holes T, and a plurality of independent adhesive structures 140a are filled into the through holes T respectively.

Figure 9A:
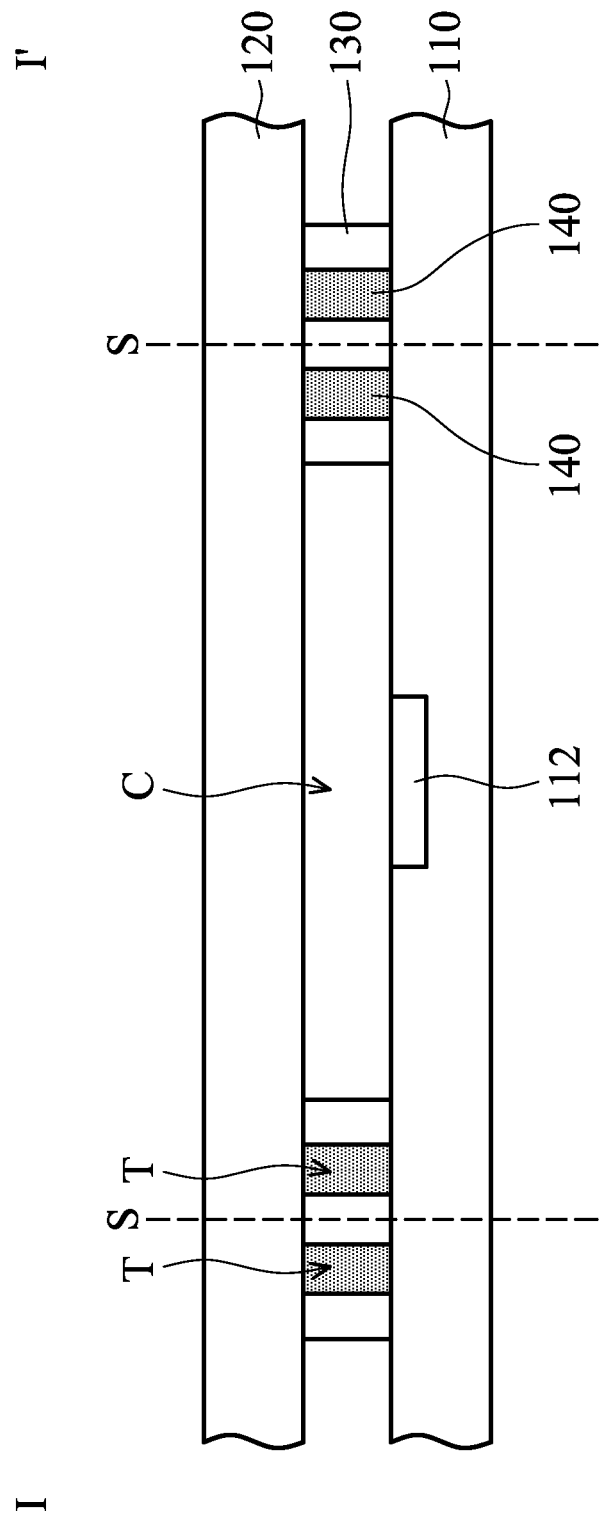
FIGS. 9A-9B are cross-sectional views showing the steps of forming a chip package according to still another embodiment of the present invention.
Figure 9B:
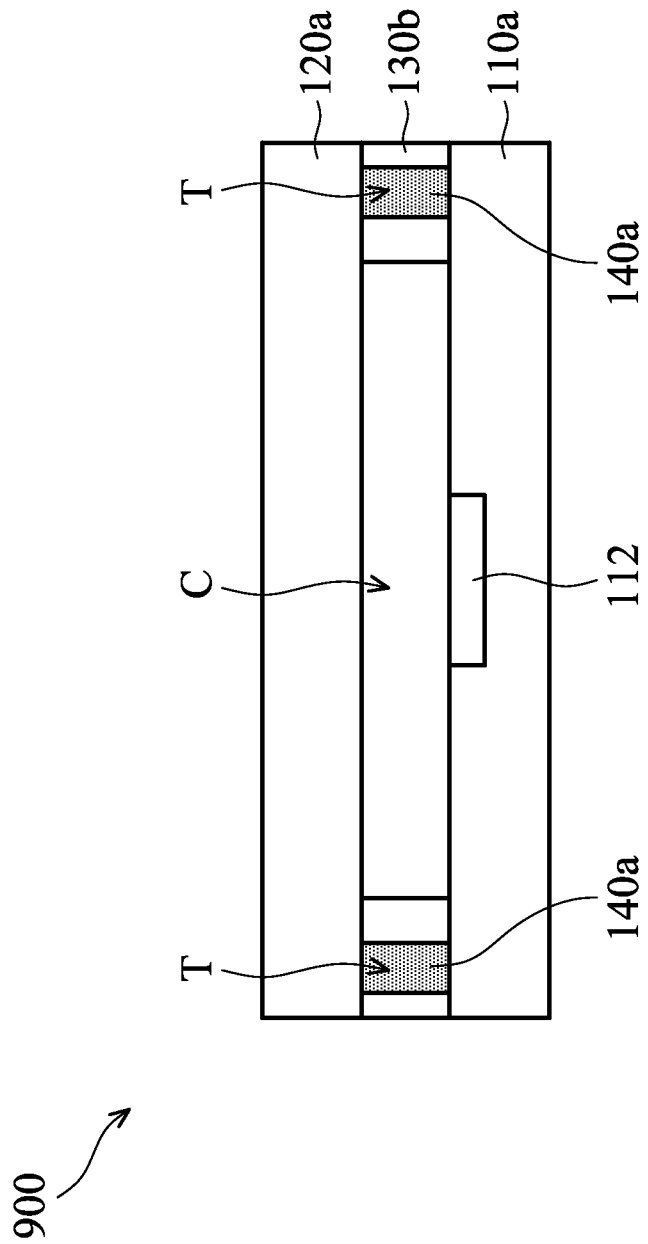

FIGS. 9A-9B are cross-sectional views showing the steps of forming a chip package according to still another embodiment of the present invention.

It should be noted that, in the present embodiment, the process for forming the chip package is similar to the process shown in FIGS. 3A-3B, and the difference therebetween is that the arrangements of the through holes T are different.

Figure 11:
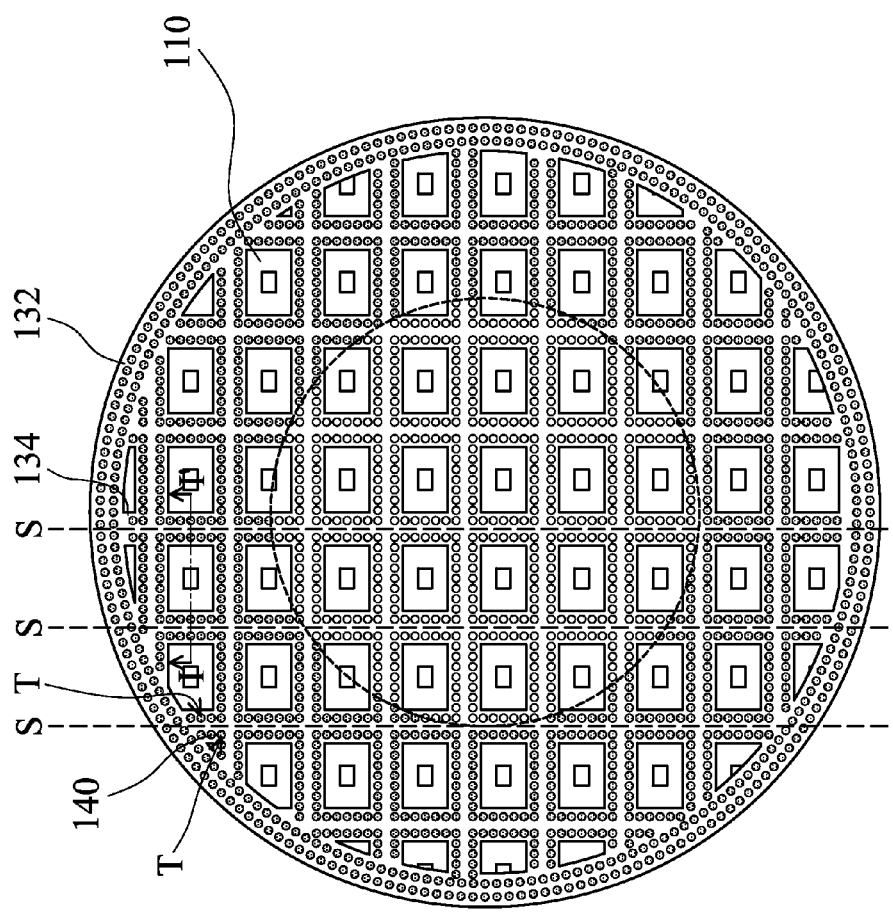
FIG. 11 is a top view of the structure shown in FIG. 9A.

FIG. 11 is a top view of the structure shown in FIG. 9A, FIG. 9A is a cross-sectional view along the line I-I' in FIG. 11, and for simplicity sake, FIG. 11 omits depicting the package substrate. Specifically, referring to FIGS. 9A and 11, for each of the scribe lines S, the through holes T include two rows of through holes T parallel to each other and located on two opposite sides of the scribe line S respectively. In other embodiments, the through holes T may include other even rows of through holes T (such as four rows, six rows, eight rows, etc.) located on two opposite sides of the scribe line S respectively.

Then, referring to FIGS. 9A and 9B, the semiconductor wafer 110, the package substrate 120, and a portion of the spacer layer 130 between the two rows of through holes T are diced along the scribe lines S to form a plurality of chip packages 900 separated from each other.

Figure 10:
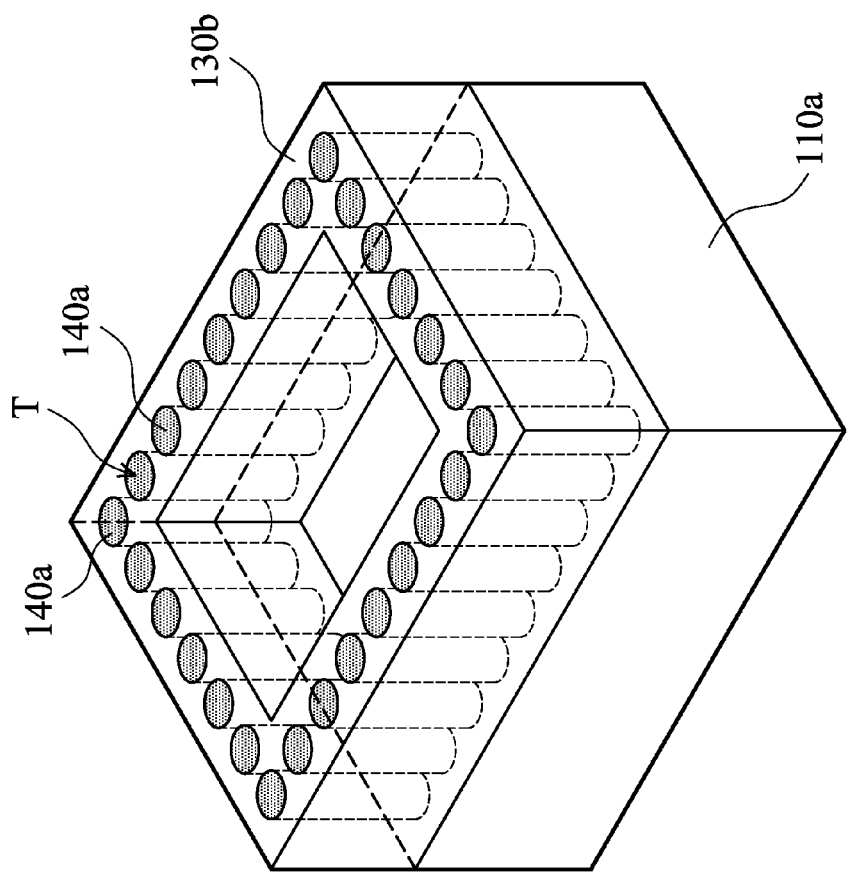
FIG. 10 is a perspective view of the chip package of FIG. 9B.

FIG. 10 is a perspective view of the chip package of FIG. 9B, and for simplicity sake, FIG. 10 omits depicting the package substrate. Referring to FIGS. 9B and 10, in the present embodiment, the chip package 900 is similar to the chip package 300 in FIG. 3B, and the difference therebetween is that the spacer layer 130b of the chip package 900 has a plurality of through holes T filled with the adhesive structures 140a respectively.

Figure 12A:
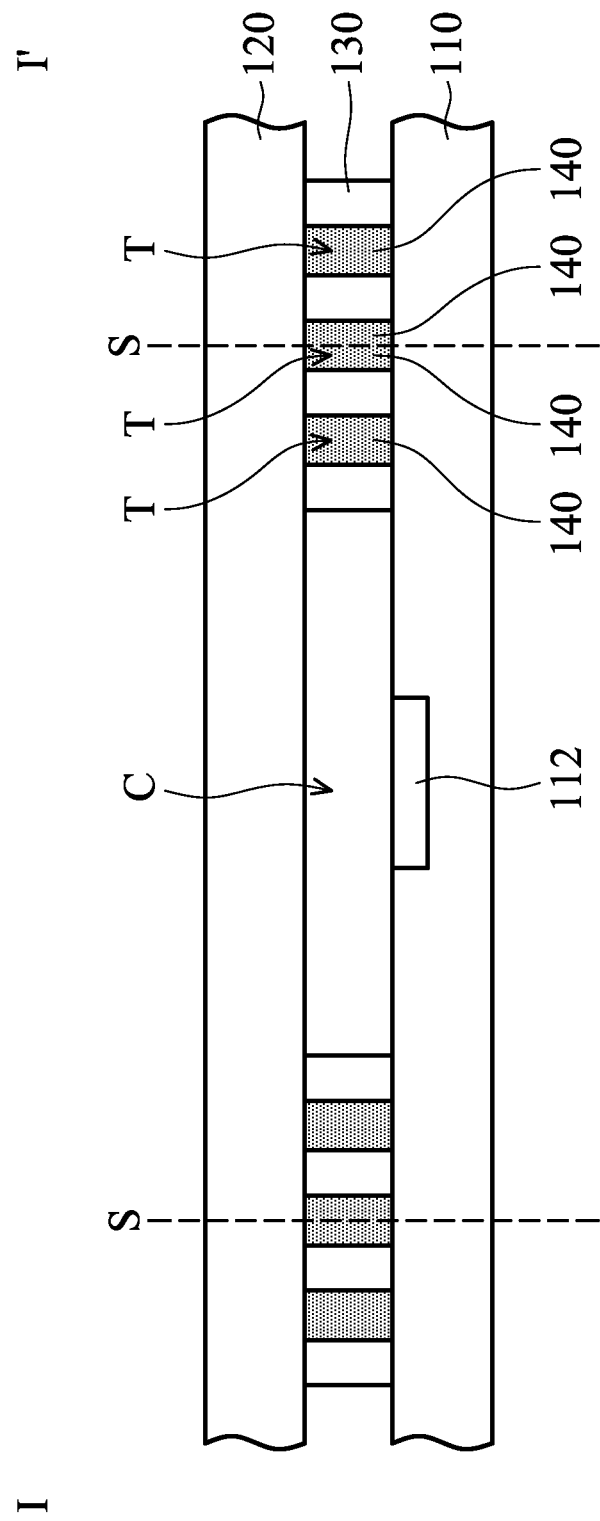
FIGS. 12A-12B are cross-sectional views showing the steps of forming a chip package according to one embodiment of the present invention.
Figure 12B:
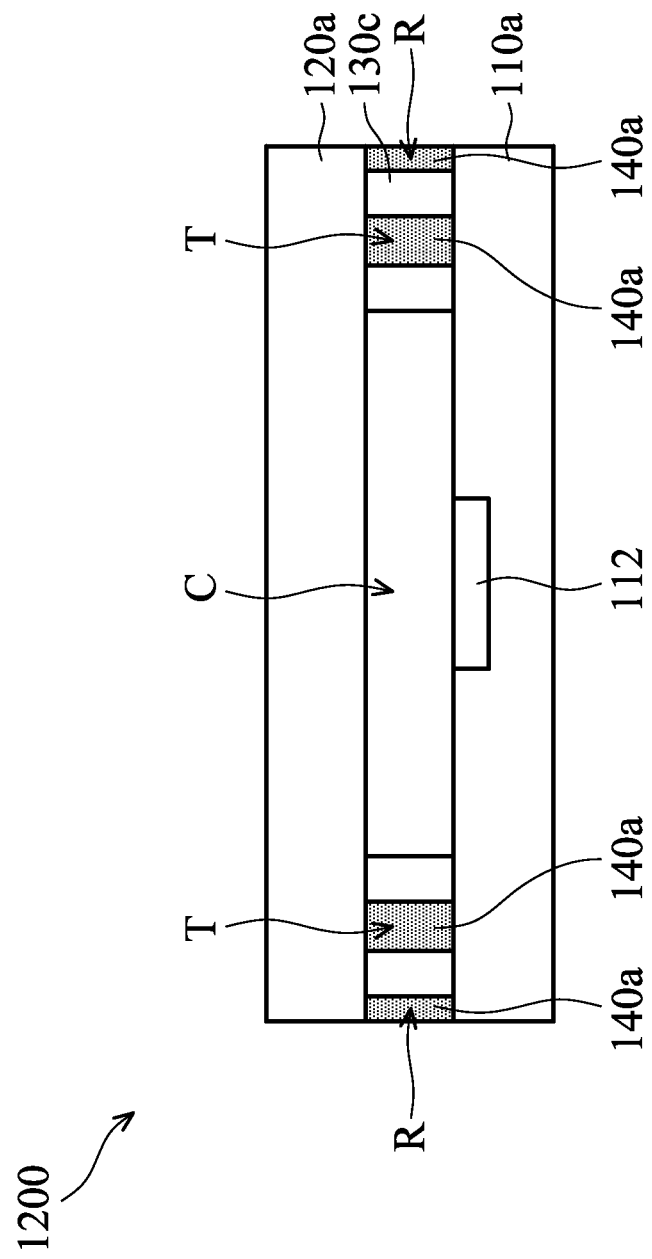

FIGS. 12A-12B are cross-sectional views showing the steps of forming a chip package according to one embodiment of the present invention.

It should be noted that, in the present embodiment, the process for forming the chip package is similar to the process shown in FIGS. 9A-9B, and the difference therebetween is that the arrangements of the through holes T are different.

Figure 14:
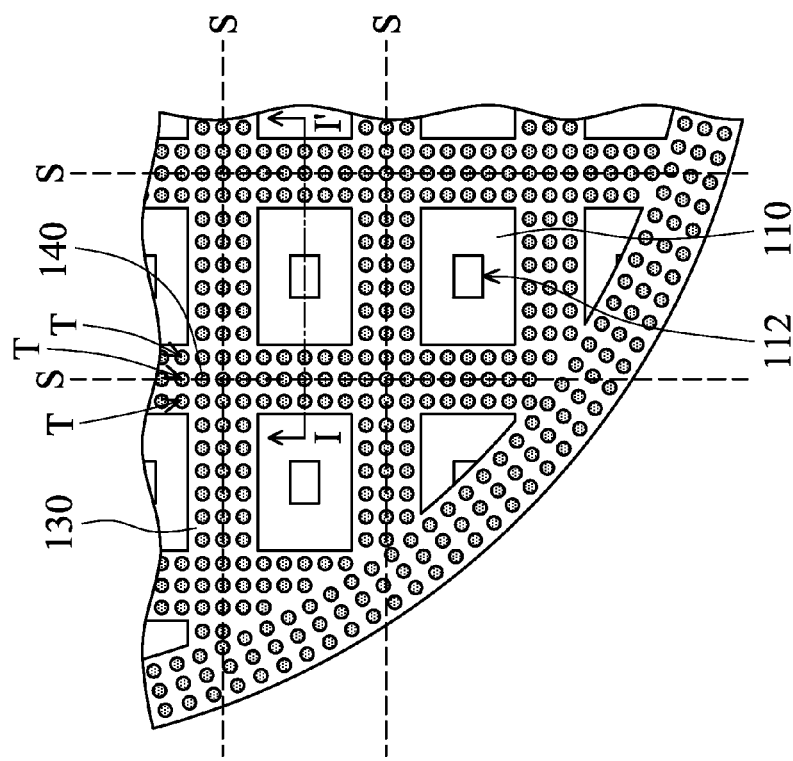
FIG. 14 is a top view of the structure shown in FIG. 12A.

FIG. 14 is a top view of the structure shown in FIG. 12A, FIG. 12A is a cross-sectional view along the line I-I' in FIG. 14, and for simplicity sake, FIG. 14 omits depicting the package substrate. Specifically, referring to FIGS. 12A and 14, for each of the scribe lines S, the through holes T include three rows of through holes T parallel to each other, wherein one of the three rows is located on the scribe line S (the one row is named middle row hereinafter), and the other two of the three rows are located on two opposite sides of the scribe line S respectively.

Then, referring to FIGS. 12A and 12B, the semiconductor wafer 110, the package substrate 120, a portion of the spacer layer 130 between the two rows of through holes T, and the adhesive material 140 in the middle row of the through holes T are diced along the scribe lines S to form a plurality of chip packages 1200 separated from each other.

Figure 13:
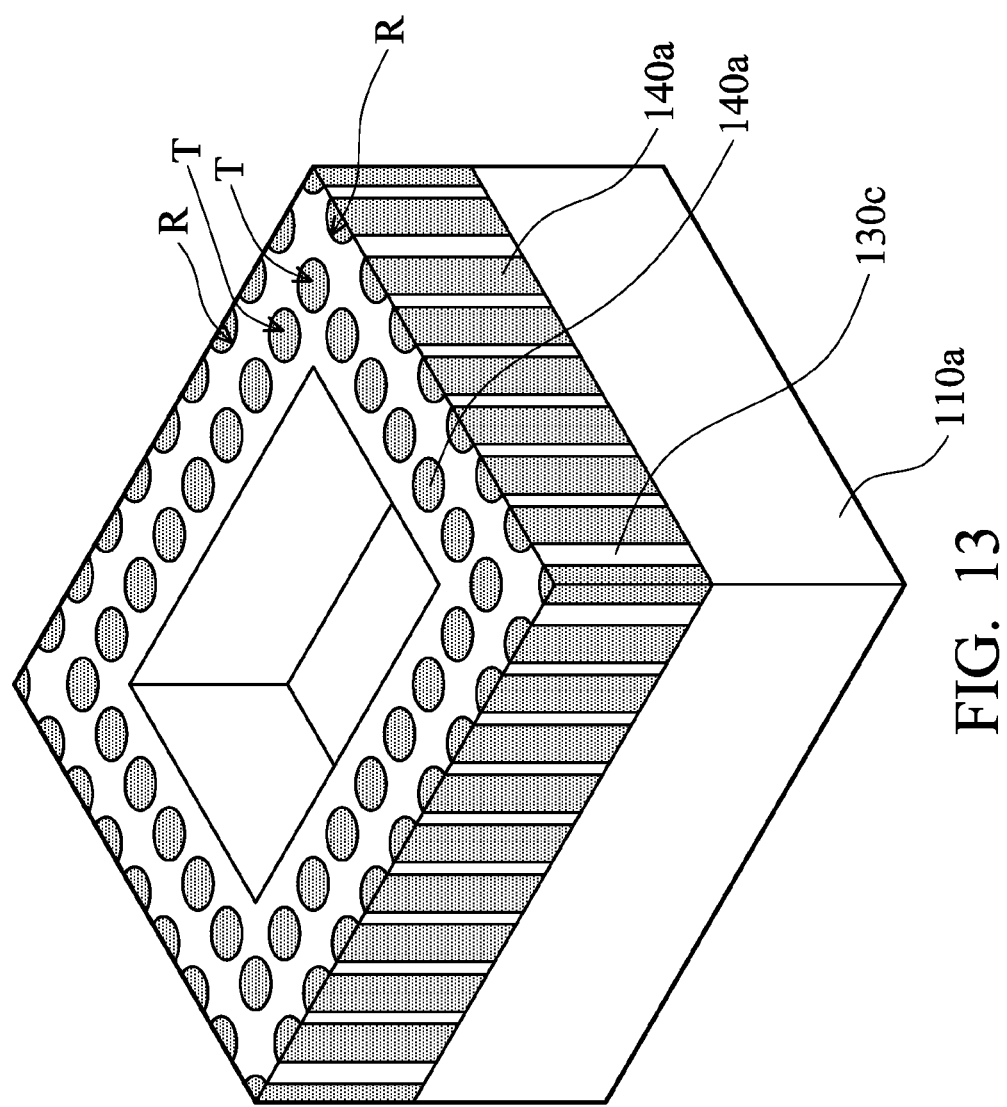
FIG. 13 is a perspective view of the chip package of FIG. 12B.

FIG. 13 is a perspective view of the chip package of FIG. 12B, and for simplicity sake, FIG. 13 omits depicting the package substrate. Referring to FIGS. 12B and 13, in the present embodiment, the chip package 1200 is similar to the chip package 300 in FIG. 3B and the chip package 900 in FIG. 9B, and the difference therebetween is that the spacer layer 130c of the chip package 1200 both has the recesses R of the chip package 300 in FIG. 3B and the through holes T of the chip package 900 in FIG. 9B, and the adhesive structures 140a fill the through holes T and the recesses R respectively.

Figure 15:
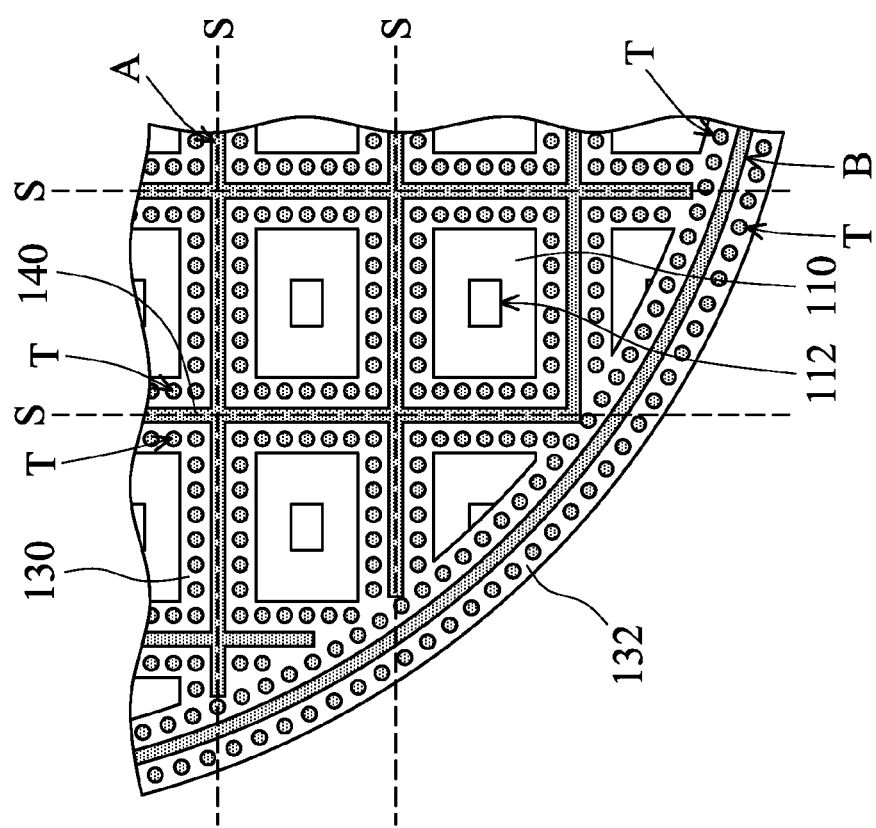
FIGS. 15-16 are cross-sectional views showing the steps of forming a chip package according to one embodiment of the present invention.
Figure 16:
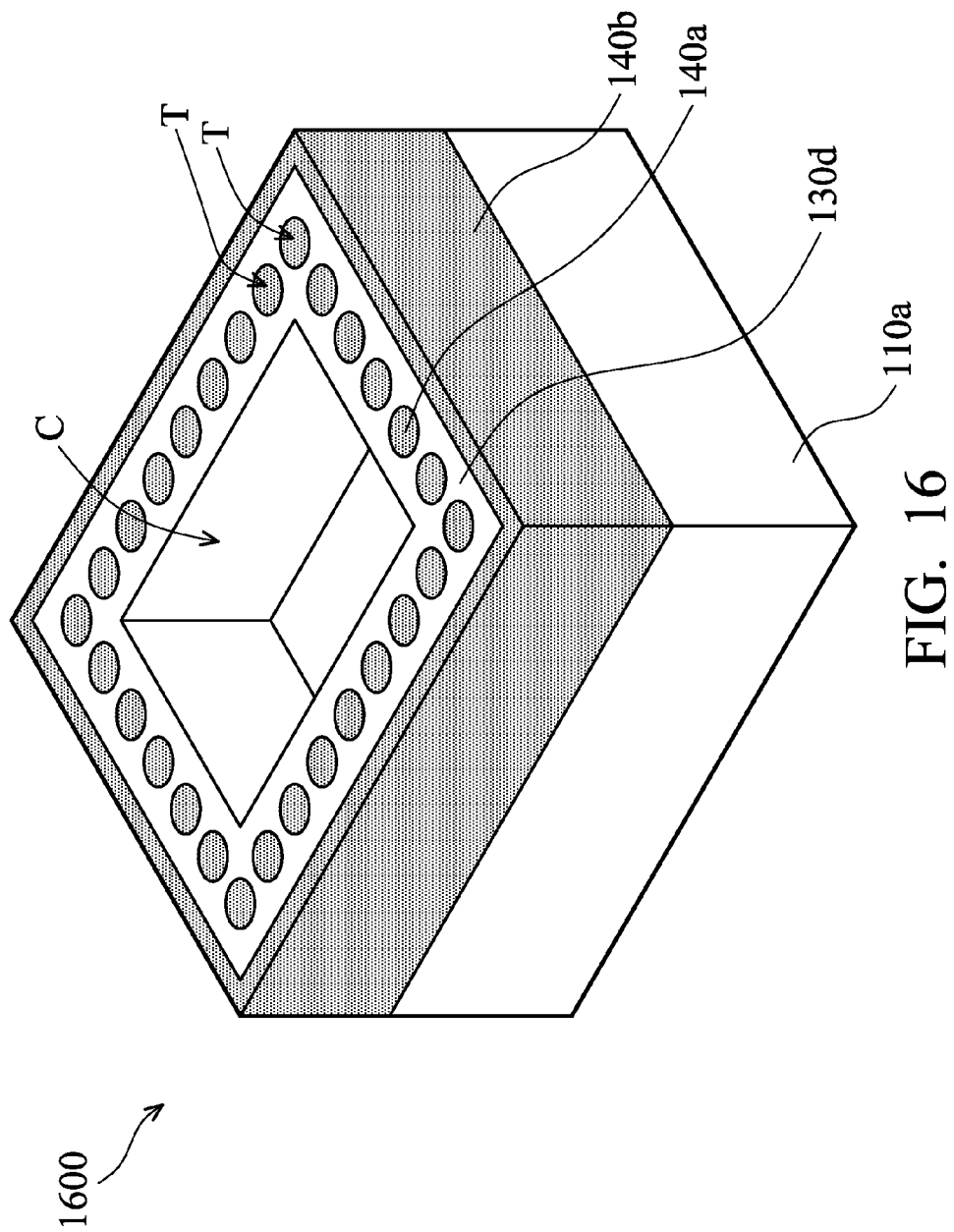

FIGS. 15-16 are schematic diagrams showing the steps of forming a chip package according to one embodiment of the present invention, and for simplicity sake, FIG. 16 omits depicting the package substrate. It should be noted that, in the present embodiment, the process for forming the chip package is similar to the process shown in FIGS. 12A-12B and 14, and as shown in FIG. 15, the difference therebetween is that a continuous trench A passing through the spacer layer 130 of the present embodiment replaces the through holes T on the scribe lines S (as shown in FIG. 14). Specifically, in the present embodiment, for each of the scribe lines S, the through holes T may optionally include two rows of through holes T parallel to each other, and the trench A (or the scribe line S) separates the two rows of through holes T parallel to each other.

Furthermore, in the present embodiment, an outer annular trench B in an annular shape may be optionally formed in the outer annular portion 132 of the spacer layer 130 and pass through the outer annular portion 132. In one embodiment, the through holes T may optionally include two rows of through holes T in the outer annular portion 132, and the two rows are on the two opposite sides of the outer annular trench B respectively.

It should be noted that, although two rows of through holes T are described as an example in the present embodiment, the relative position of the through holes T and the trench A (or the outer annular trench B) is not limited thereto. That is to say, in other embodiments, the relative position of the through holes T and the trench A (or the outer annular trench B) may be adjusted according to actual demands.

After forming the spacer layer 130 on the semiconductor wafer 110, the adhesive material 140 is filled in the trench A, the outer annular trench B, and the through holes T. Then, the semiconductor wafer 110, the package substrate, and the adhesive material 140 in the trench A are diced along the scribe lines S to form a plurality of chip packages 1600 separated from each other (as shown in FIG. 16).

Referring to FIG. 16, in the present embodiment, the chip package 1600 is similar to the chip package in FIG. 13, and the difference therebetween is that the spacer layer 130d of the chip package 1600 does not have recesses, and a continuous annular adhesive structure 140b surrounds and covers the sidewall of the spacer layer 130d and is outside of the cavity C. Moreover, the adhesive structures 140a are filled in the through holes T respectively.

Figure 17:
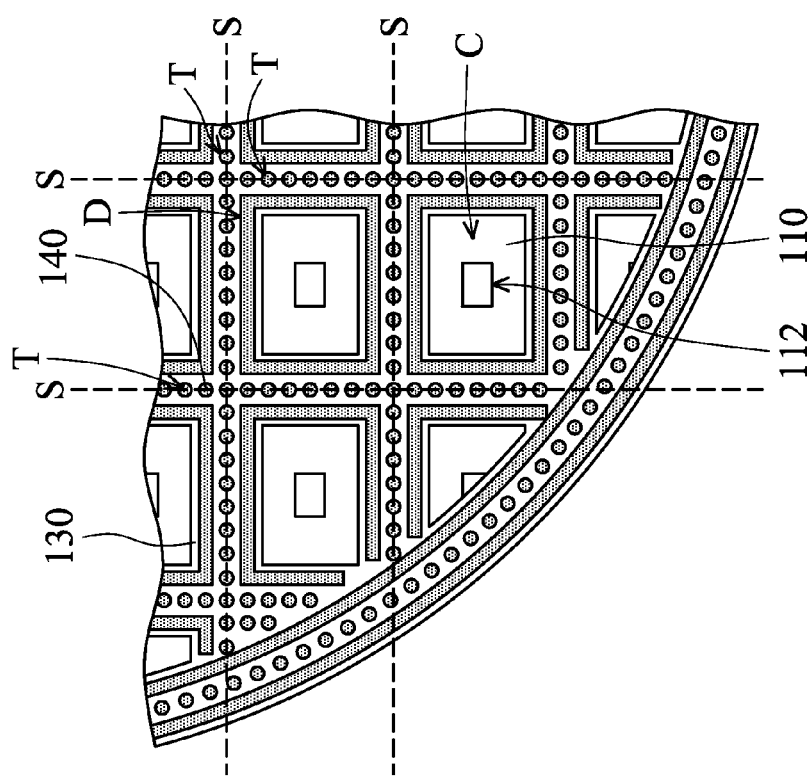
FIGS. 17-18 are cross-sectional views showing the steps of forming a chip package according to one embodiment of the present invention.
Figure 18:
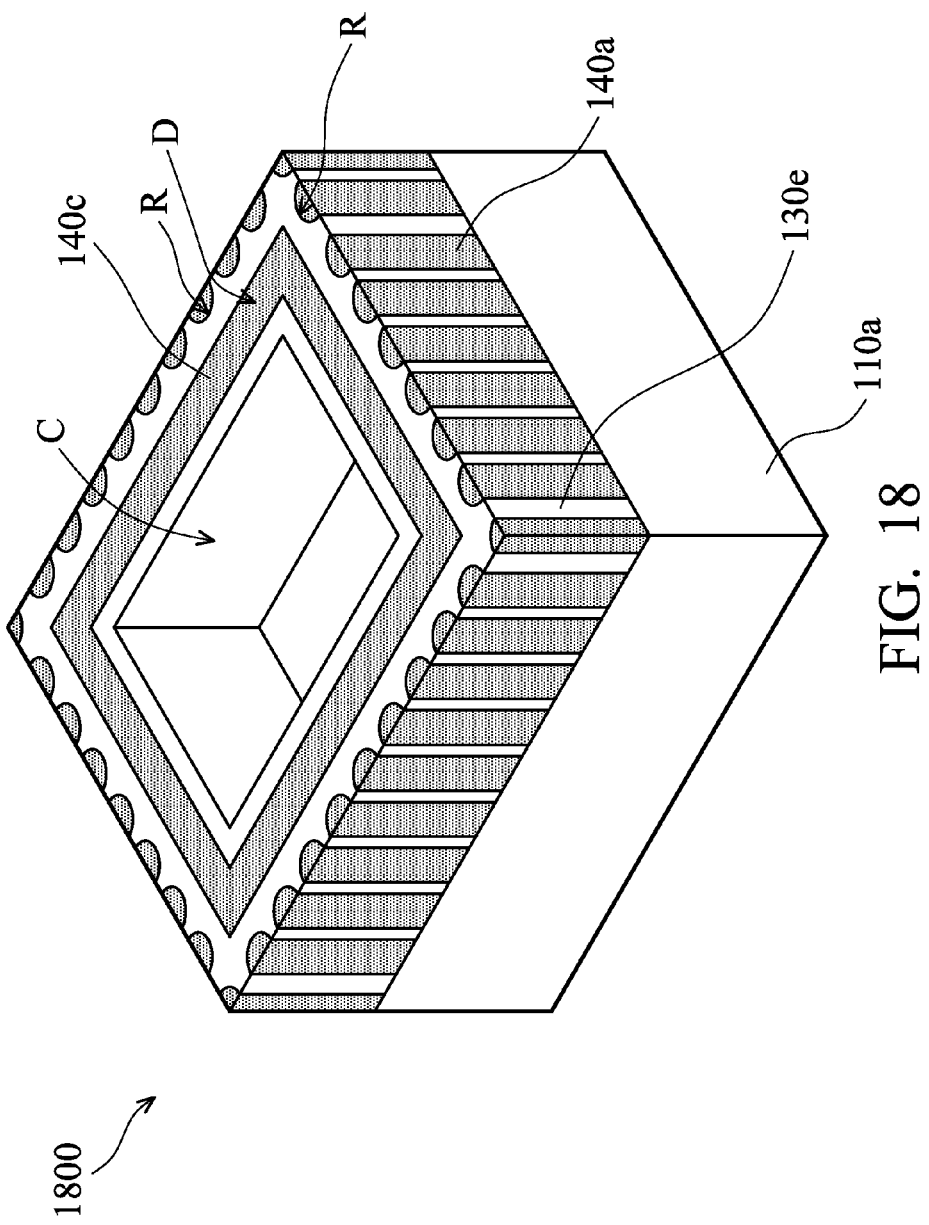

FIGS. 17-18 are schematic diagrams showing the steps of forming a chip package according to one embodiment of the present invention, and for simplicity sake, FIG. 18 omits depicting the package substrate. It should be noted that, in the present embodiment, the process for forming the chip package is similar to the process shown in FIGS. 12A-12B and 14, and the difference therebetween is that a plurality of annular grooves D passing through the spacer layer 130 of the present embodiment replace the through holes T beside the scribe lines S (as shown in FIG. 14). Specifically, referring to FIG. 17, each of the annular grooves D surrounds the corresponding cavity C (or the device region 112), and the through holes T are between two neighboring annular grooves D.

It should be noted that, although the through holes T between two neighboring annular grooves D are described as an example in the present embodiment, the relative position of the through holes T and the annular grooves D is not limited thereto. That is to say, in other embodiments, the relative position of the through holes T and the annular grooves D may be adjusted according to actual demands.

After forming the spacer layer 130 on the semiconductor wafer 110, the adhesive material 140 is filled in the annular grooves D and the through holes T. Then, the semiconductor wafer 110, the package substrate, a portion of the spacer layer 130 between two neighboring annular grooves D, and the adhesive material 140 in the through holes T are diced along the scribe lines S to form a plurality of chip packages 1800 separated from each other (as shown in FIG. 18).

Referring to FIG. 18, in the present embodiment, the chip package 1800 is similar to the chip package in FIG. 13, and the difference therebetween is that the spacer layer 130e of the chip package 1800 has a continuous annular groove D and does not have the through holes T. The annular groove D passes through the spacer layer 130e and surrounds the cavity C (or the device region), and a continuous annular adhesive structure 140c is filled in the annular groove D. Furthermore, the adhesive structures 140a are filled in the recesses R respectively.

In view of the foregoing, in the present invention, the adhesive material passes through the spacer layer neighboring the edge of the semiconductor wafer so as to effectively improve the adhesion of the spacer layer to the semiconductor wafer and/or the package substrate, which prevents delamination occurring in the laminated structure during subsequent processes (such as thermal processes) and improves the yield of the chip packaging process.

Furthermore, in the present invention, the adhesive material passes through the spacer portion of the spacer layer, which may improve the adhesion of the spacer portion to the semiconductor wafer and/or the package substrate so as to improve the yield of the chip packaging process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of a chip package, comprising:
providing a semiconductor wafer having a plurality of device regions separated by a plurality of scribe lines;
bonding a package substrate to the semiconductor wafer, wherein a spacer layer of single material is disposed therebetween and defines a plurality of cavities respectively exposing the device regions, wherein each cavity is defined within a perimeter having sides not extending beyond immediate adjacent scribe lines, wherein the spacer layer has a plurality of independent through holes disposed at each of the sides of the perimeter and surrounding and neighboring the edge of each cavity, and wherein each through hole itself does not completely surround any device region;
filling an adhesive material in the through holes wherein the single material of the spacer layer is adhesive and different from the adhesive material, and wherein the adhesive material and the single material of the spacer layer are non-electrically conductive; and
dicing the semiconductor wafer, the package substrate and the spacer layer along the scribe lines to form a plurality of chip packages separated from each other.

2. The manufacturing method of the chip package as claimed in claim 1, wherein the through holes are located between any two neighboring device regions, wherein each through hole is independently defined by a continuous surrounding wall within the spacer layer.

3. The manufacturing method of the chip package as claimed in claim 2, wherein the through holes are located on the scribe lines, and the step of dicing the semiconductor wafer, the package substrate and the spacer layer comprises:
dicing the adhesive material in the through holes along the scribe lines.

4. The manufacturing method of the chip package as claimed in claim 2, wherein the through holes comprise at least two rows of through holes parallel to each other and located on two opposite sides of one of the scribe lines respectively, and the step of dicing the semiconductor wafer, the package substrate and the spacer layer comprises:
dicing a portion of the spacer layer between the two rows of through holes along the scribe line.

5. The manufacturing method of the chip package as claimed in claim 1, wherein the spacer layer comprises an outer annular portion neighboring the edge of the semiconductor wafer, and the through holes are located in the outer annular portion.

6. The manufacturing method of the chip package as claimed in claim 1, wherein the spacer layer comprises a plurality of inner annular structures located in the cavities respectively and surrounding the device regions exposed by the cavities respectively, and the through holes pass through the inner annular structures.

7. The manufacturing method of the chip package as claimed in claim 1, wherein the spacer layer further has a plurality of second through holes neighboring the center of the semiconductor wafer, and the manufacturing method of the chip package further comprises:
filling the adhesive material in the second through holes.

8. The manufacturing method of the chip package as claimed in claim 1, wherein the adhesive material has an adhesion greater than that of the spacer layer.

9. The manufacturing method of the chip package as claimed in claim 1, wherein the adhesive material has a hardness less than that of the spacer layer.

10. The manufacturing method of the chip package as claimed in claim 1, further comprising:
after filling the adhesive material in the through holes and bonding the semiconductor wafer and the package substrate, performing a thermal curing process to the spacer layer and the adhesive material to cure the spacer layer and the adhesive material.

11. The manufacturing method of the chip package as claimed in claim 1, wherein the spacer layer further has a trench passing through the spacer layer and on the scribe lines, and the manufacturing method of the chip package further comprises:
filling the adhesive material in the trench,
wherein the step of dicing the semiconductor wafer, the package substrate and the spacer layer comprises:
dicing the adhesive material in the trench along the scribe lines.

12. The manufacturing method of the chip package as claimed in claim 11, wherein the through holes comprise at least two rows of through holes parallel to each other, and the trench separates the two rows of through holes.

13. The manufacturing method of the chip package as claimed in claim 1, wherein the spacer layer further has a plurality of annular grooves, wherein each of the annular grooves passes through the spacer layer and surrounds the corresponding cavity, and the manufacturing method of the chip package further comprises:
filling the adhesive material in the annular grooves.

14. The manufacturing method of the chip package as claimed in claim 13, wherein the through holes are located on the scribe lines and between any two neighboring annular grooves, and the step of dicing the semiconductor wafer, the package substrate and the spacer layer comprises:
dicing the adhesive material in the through holes along the scribe lines.

15. The manufacturing method of the chip package as claimed in claim 1, wherein the spacer layer comprises an outer annular portion neighboring the edge of the semiconductor wafer, the spacer layer further has an outer annular trench with an annular shape, and the outer annular trench passes through the spacer layer and is located in the outer annular portion.

16. A chip package, comprising:
a semiconductor substrate having a device region;
a package substrate disposed on the semiconductor substrate;
a spacer layer of single material disposed between the semiconductor substrate and the package substrate, defining a cavity exposing the device region, wherein the cavity is defined within a perimeter having sides immediately adjacent the cavity; and a plurality of independent adhesive structures embedded in the spacer layer and located at each of the sides of the perimeter outside of the cavity, wherein the adhesive structures surround and neighbor the edges of the cavity, wherein each adhesive structure itself does not completely surround any device region;

wherein the single material of the spacer layer is different from that of the adhesive structures, and wherein the adhesive material and the single material of the spacer layer are non-electrically conductive.

17. The chip package as claimed in claim 16, wherein the spacer layer has a sidewall facing away from the cavity, the sidewall has a plurality of recesses extending from the semiconductor substrate to the package substrate, and the adhesive structures fill the recesses respectively.

18. The chip package as claimed in claim 17, wherein each of the adhesive structures has a second sidewall facing away from the cavity and aligned with the sidewall of the spacer layer.

19. The chip package as claimed in claim 16, wherein the spacer layer has a plurality of discrete through holes each independently defined by a continuous surrounding wall within the spacer layer, and the adhesive structures fill the through holes respectively.

20. The chip package as claimed in claim 16, wherein the spacer layer comprises an inner annular structure in the cavity, and the inner annular structure has a plurality of through holes, and the chip package further comprises:

a plurality of independent second adhesive structures, filling the through holes respectively, wherein the material of the spacer layer is different from the material of the second adhesive structures.

21. The chip package as claimed in claim 16, wherein the spacer layer physically contacts the semiconductor substrate and the package substrate.

22. The chip package as claimed in claim 16, wherein each of the adhesive structures extends from the semiconductor substrate to the package substrate.

23. The chip package as claimed in claim 16, further comprising:

a continuous annular adhesive structure surrounding and covering the sidewall of the spacer layer and located outside of the cavity.

24. The chip package as claimed in claim 16, wherein the spacer layer has an annular groove passing through the spacer layer and surrounding the cavity, and the chip package further comprises:

a continuous annular adhesive structure filling the annular groove.

* * * * *